United States Patent
Phillips et al.

(10) Patent No.: US 7,129,170 B2
(45) Date of Patent: Oct. 31, 2006

(54) METHOD FOR DEPOSITING AND ETCHING RUTHENIUM LAYERS

(75) Inventors: James E. Phillips, Somerville, NJ (US); Len D. Spaulding, Newark, DE (US)

(73) Assignee: Colonial Metals, Inc., Elkton, MD (US)

( * ) Notice: Subject to any disclaimer, the term of this patent is extended or adjusted under 35 U.S.C. 154(b) by 0 days.

(21) Appl. No.: 11/200,073

(22) Filed: Aug. 10, 2005

(65) Prior Publication Data
US 2005/0272238 A1  Dec. 8, 2005

Related U.S. Application Data

(62) Division of application No. 10/170,686, filed on Jun. 14, 2002, now abandoned, which is a division of application No. 09/655,307, filed on Sep. 5, 2000, now Pat. No. 6,458,183.

(51) Int. Cl.
*H01L 21/44* (2006.01)
(52) U.S. Cl. .............................. 438/686; 257/E21.195
(58) Field of Classification Search ................ 438/686
See application file for complete search history.

(56) References Cited

U.S. PATENT DOCUMENTS 6,517,616 B1 *  2/2003  Marsh et al. ............... 106/1.21
6,537,461 B1 *  3/2003  Nakahara et al. ............. 216/67

OTHER PUBLICATIONS

S. M. Gasser et al. "Instability of Amorphous Ru-Si-O Thin Films under Thermal Oxidation", Journal of the Electrochemical Society, vol. 146(4) pp. 1546-1548, 1999.*

* cited by examiner

*Primary Examiner*—W. David Coleman
(74) *Attorney, Agent, or Firm*—Harness,Dickey & Pierce

(57) ABSTRACT

The present invention provides a method for purifying ruthenium sources to obtain high purity ruthenium metal and form a ruthenium metal pattern on a semiconductor substrate without the need for high temperature processing or a complex series of wet processes. A gas stream including ozone ($O_3$) is brought into contact with a ruthenium source in one or more reaction vessels to form ruthenium tetraoxide ($RuO_4$), a compound that is a gas at the reaction conditions. The ruthenium tetraoxide, along with unreacted ozone and the remainder of the gas stream is then fed into a collection vessel where the gaseous ruthenium tetraoxide is reduced to form a ruthenium dioxide ($RuO_2$) layer on a semiconductor substrate. The deposited ruthenium dioxide is then reduced, preferably with hydrogen, to produce highly pure ruthenium metal that may be, in turn, patterned and dry etched using ozone as an etchant gas.

12 Claims, 3 Drawing Sheets

METHOD FOR DEPOSITING AND ETCHING RUTHENIUM LAYERS

PRIORITY STATEMENT

This application is a divisional application from U.S. patent application Ser. No. 10/170,686 filed Jun. 14, 2002, now abandoned, which was a divisional application from U.S. patent application Ser. No. 09/655,307 filed Sep. 5, 2000, now U.S. Pat. No. 6,458,183 B1, which is incorporated herein, in its entirety, by reference.

BACKGROUND OF THE INVENTION

1. Field of the Invention

The present invention relates to a method and apparatus for the production of highly pure ruthenium and ruthenium dioxide.

2. Description of the Related Art and General Background

A member of the platinum group, ruthenium occurs naturally with other members of the platinum group in ores found in Russia's Ural mountains, North and South America, and particularly, South Africa. It is also found along with other platinum metals in small but commercial quantities in both the pentlandite of the Sudbury, Ontario, nickel-mining region, and in the pyroxinite deposits of South Africa. Commercially, ruthenium may be isolated from the other platinum metals through several complex chemical processes, the final stage of which generally includes the hydrogen reduction of ammonium ruthenium chloride or nitrosylruthenium chloride, to produce ruthenium metal powder.

Ruthenium, a hard, white metal, is one of the most effective hardeners for platinum and palladium and is typically alloyed with these metals to produce electrical contacts for severe wear resistance. There have also been reports that a ruthenium alloy, specifically a ruthenium-molybdenum alloy, exhibits superconductivity at 10.6° K. It has also been reported that the corrosion resistance of titanium can be improved over 100 times by adding as little as 0.1% ruthenium. Ruthenium is also a versatile catalyst and is frequently used in petrochemical and other industrial processes to remove $H_2S$.

One method for extracting ruthenium is disclosed in U.S. Pat. No. 3,997,337 ("the '337 patent"). The '337 patent included a discussion of both earlier methods for the separation and purification of precious metals, including ruthenium, from a concentrate of by-metals and the improved method taught by the patent. The improvement disclosed in the '337 patent for the separation and purification of precious metals, including ruthenium, from a concentrate of by-metals comprised heating the concentrate to a temperature between 1100° C. and 1500° C., preferably at about 1300° C., in a gaseous stream which comprises oxygen. This heating step is continued for a period sufficient to ensure quantitative removal of one or more of lead, arsenic, silver, bismuth and/or tellurium and the oxidation of ruthenium, rhodium and iridium. The referenced by-metal concentrate is obtained as a by-product of the separation of platinum, palladium, and gold from an ore or other mixed source.

In the previous process, the by-metal concentrate was fused with potassium bisulphate ($KHSO_4$) to convert the rhodium to the water-soluble sulphate, $Rh_2(SO_4)_3$, which can be removed by washing. The remaining residue was then subjected to a sodium peroxide ($Na_2O_2$) fusion to convert the ruthenium and osmium to water soluble sodium salts of their oxo-anions (e.g. $RuO_4^{2-}$ and $Os_4^{2-}$ respectively) and to convert the iridium to an acid soluble hydrous oxide (probably $IrO_2.nH_2O$). The ruthenium and osmium were then separated from the iridium by treating the sodium peroxide melt with water to form a precipitate, and treating the precipitate with hydrochloric acid to dissolve the iridium. The ruthenium and osmium were then normally purified by a collective chlorine distillation, followed by a nitric acid distillation for osmium. The rhodium is treated for the removal of impurities such as palladium, tellurium and other base metals that are also rendered soluble by the $KHSO_4$ fusion. The iridium has to be separated from large quantities of lead and other impurities present in the concentrate which have been rendered soluble by the sodium peroxide ($Na_2O_2$) fusion. As can be appreciated, this method used both large quantities of concentrates and correspondingly large quantities of costly reagents. Further, the impurities, in particular tellurium were sometimes difficult to remove.

The improvement outlined in the '337 patent was intended to provide a process for the treatment of a by-metal concentrate for 1) to remove troublesome impurities such as Te, As, Bi, Ag, and Pb; 2) the removal of osmium; and 3) to reduce the bulk of the by-metals being refined thereby providing saving in both reagents and equipment. This was accomplished by treating a concentrate of by-metals by heating to between about 1100° C. and 1500° C. in an oxygen-containing gaseous stream for a period of time (examples include times of 20 hours) sufficient to ensure both quantitative removal of one or more of lead, arsenic, silver, bismuth and/or tellurium and the oxidation of ruthenium, rhodium and iridium to their oxides. According to the patent, the oxygen-containing gaseous stream could be air and the exhaust gas could be scrubbed with a liquid to recover osmium. The '337 patent also provided for the separation of ruthenium from the other platinum group metals by fusing the ignited by-metal concentrate with potassium hydroxide and leaching the melt with water to dissolve ruthenium complexes formed during the fusion process. As described in the '337 patent, a by-metal concentrate was heated to about 1300° C. for 20 hours in a stream of air, a process by which osmium, together with lead, arsenic, silver, bismuth and tellurium, were quantitatively removed from the concentrate while less than 10% of the ruthenium and only traces of the other platinum group metals were volatilized. The vapors were scrubbed with a 10% NaOH solution to precipitate all the metals, with the exception of ruthenium and osmium, as hydrous oxides (which settle to the bottom of the receiving vessel). The ruthenium and osmium oxides which are converted to soluble sodium salts according to the following reactions:

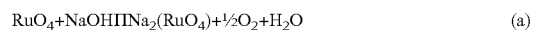
$RuO_4+NaOH\Pi Na_2(RuO_4)+\frac{1}{2}O_2+H_2O$ (a)

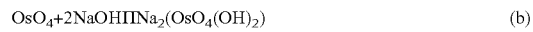
$OsO_4+2NaOH\Pi Na_2(OsO_4(OH)_2)$ (b)

The ruthenium was then precipitated from the alkali solution by the addition of ethanol to reduce the oxo-anion $RuO_4^{2-}$ and precipitate the insoluble hydrous oxide (reported as $Ru_2O_3.nH_2O$ but the applicants believe $RuO_2.nH_2O$ may be more accurate). This precipitate is filtered off together with the sludge in the receiver which contains the other metals which have been volatized and is recycled to the lead alloying stage of the metal process or to some other convenient point if lead alloying is not utilized. The osmium remaining in solution is then precipitated at room temperature as a hydrous oxide (reported as $OS_2O_3.nH_2O$, but the applicants believe $OsO_2.nH_2O$ may be more accurate) by acidifying the solution with HCl to a pH of 4.0.

U.S. Pat. No. 4,105,442 ("the '442 patent") teaches an alternative process for the separation and purification of ruthenium involving the conversion of the ruthenium present in solution to a nitrosylruthenium complex with the ruthenium in the Ru+2 oxidation state. The nitrosylruthenium complex is then converted to a nitrosylruthenium chlorocomplex, which is then removed from solution using a suitable liquid or resin anion exchanger.

The '442 patent notes the existence of conventional techniques for the recovery and purification of ruthenium and osmium based on the formation of low boiling temperature oxides in solution, with the oxides being subsequently removed from the solution by heating. For osmium, oxidation of the metal to the VIII oxidation state is relatively easy, and a number of oxidizing agents can be used. Furthermore, osmium can be efficiently removed as the tetraoxide forms even under fairly strongly acid conditions. In the case of ruthenium however, the oxidation is more difficult and control of the solution pH at a relatively high value is essential. Under these circumstances, removal of ruthenium from solution is incomplete, typically leaving several hundred parts per million of ruthenium in the solution. This not only represents a loss in ruthenium recovery, but the remaining ruthenium constitutes an impurity element during the refining and recovery of the other platinum group metals. Further disadvantages of this process include contamination of the ruthenium distillate with an acid and the explosion danger associated with the highly unstable nature of ruthenium tetraoxide.

Other methods for the separation and purification of ruthenium using solvent extraction and ion exchange methods have met with limited success and usually involve solvent extraction from a nitric acid solution. In such solutions ruthenium occurs as a series of nitrosylruthenium nitrate complexes that can be separated from the solution by solvent extraction with, typically, long chain tertiary amines. It is well known that ruthenium forms a very large number of nitrosylruthenium complexes and that the stability of such complexes is greater for ruthenium than for any other element. Thus, for example, in hydrochloric acid solution the nitrosylruthenium complex $RuNOCl_{2-5}$ can be formed. This complex is highly extractable, may be formed preferentially, and allows for the separation of ruthenium from the other platinum group metals. This process, however, has its own drawbacks, including 1) the available methods of making the nitrosylruthenium complex typically yield only 90–95% and 2) the other platinum group metals present tend to form complexes that exhibit similar behavior towards anionic solvent extractants.

The '442 patent goes on to address these issues to provide a process for the extraction of ruthenium as a nitrosylruthenium complex with both high yield and selectivity with respect to the other platinum group metals.

Yet another alternative process for the purification of ruthenium metal involved zone-refining. According to this process, a sample of impure ruthenium metal is subjected to one or more heat treatments to form a zone of molten ruthenium, surrounded by solid ruthenium, and move this molten zone along the ruthenium sample and thereby segregate impurities from the ruthenium. Although this technique can produce very pure ruthenium, ruthenium's relatively high melting point (approximately 2280° C.) makes this process very energy intensive and requires more specialized equipment to implement than the applicants' invention.

BRIEF SUMMARY OF THE INVENTION

The present invention comprises a new and improved method capable of purifying ruthenium sources to obtain high purity ruthenium without the need for high temperature processing, expensive reagents, complex series of wet processes, or expensive equipment required to practice prior art processes. According to the present invention, a gas stream including ozone ($O_3$) is brought into contact with a ruthenium source in one or more reaction vessels. The ozone reacts with the ruthenium present in the ruthenium source to form ruthenium tetraoxide ($RuO_4$), a compound that is a gas at the reaction conditions. The ruthenium tetraoxide, along with unreacted ozone and the remainder of the gas stream is then fed into a heated collection vessel where a major portion of the gaseous ruthenium tetraoxide is reduced to form ruthenium dioxide ($RuO_2$) deposits within the collection vessel. The deposited ruthenium dioxide is then reduced, preferably with hydrogen, to produce the purified ruthenium.

DETAILED DESCRIPTION OF THE INVENTION

Figure 1:
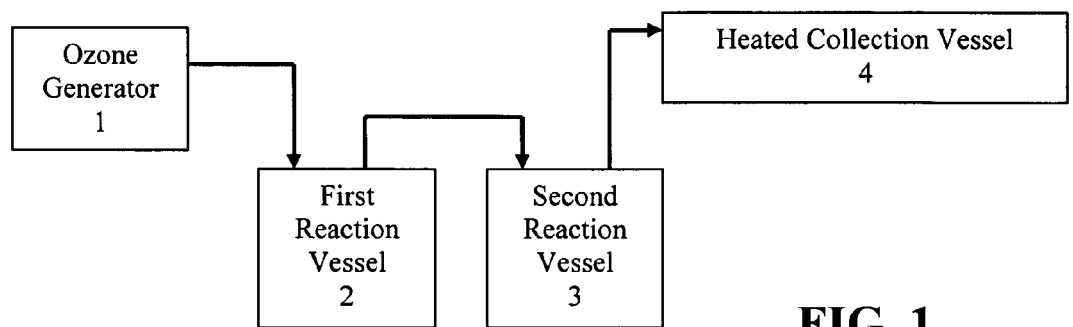
FIG. 1 illustrates a basic embodiment of an apparatus that may be used to practice the disclosed method of ruthenium purification.
Figure 2:
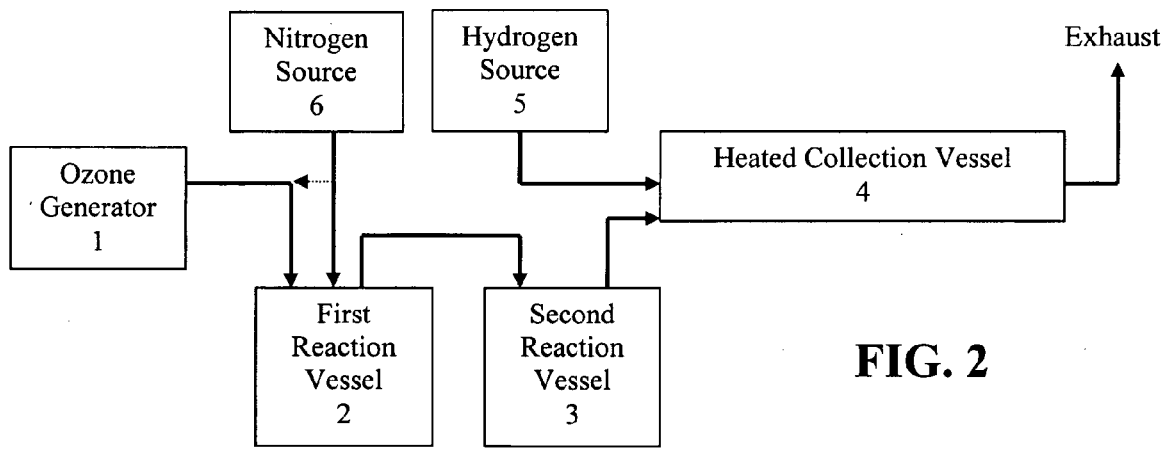
FIG. 2 illustrates an alternative embodiment of an apparatus that may be used to practice the disclosed method of ruthenium purification that includes a hydrogen source.
Figure 3:
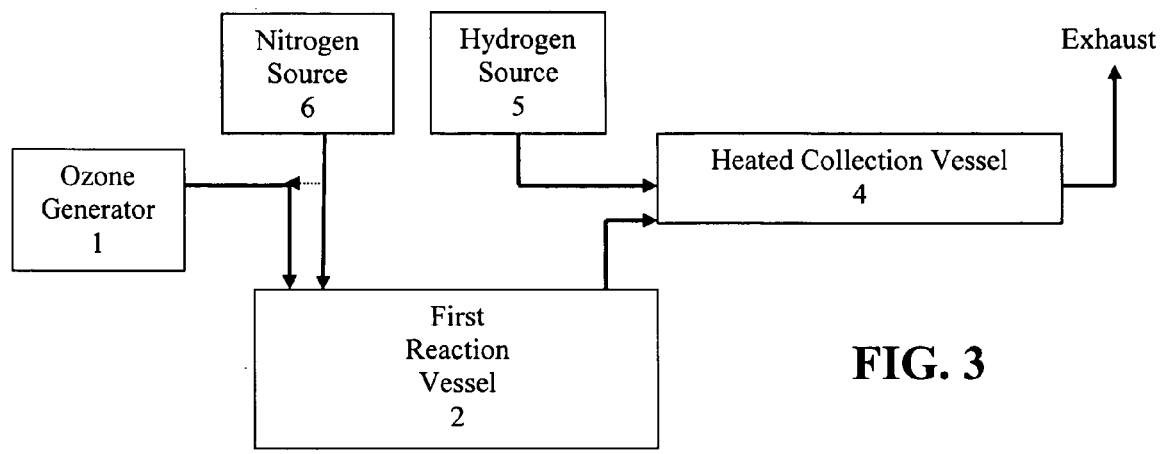
FIG. 3 illustrates an alternative embodiment of an apparatus that may be used to practice the disclosed method of ruthenium purification that includes only a single reaction vessel.

The present invention comprises a new and improved method capable of purifying ruthenium sources to obtain high purity ruthenium without the need for high temperature processing, expensive reagents, complex series of wet processes, or expensive equipment required to practice prior art processes. According to the present invention, a gas stream including ozone ($O_3$) is brought into contact with a ruthenium source in one or more reaction vessels. The ozone reacts with the ruthenium present in the ruthenium source, likely according to the reaction (1), to form ruthenium tetraoxide ($RuO_4$) a compound that is a gas at the reaction conditions.

$$Ru+mO_3 \rightarrow RuO_{4+nO2} \qquad (1)$$

In its crystal form, ruthenium (VIII) oxide ($RuO_4$), is a golden yellow, highly volatile, solid at room temperature. It has a melting point of 25.4 degrees C. and a boiling point of 40 degrees C. It is sparingly soluble in water (2% w/v at 20 degrees C.) and, although freely soluble in carbon tetrachloride, can react violently with other organic solvents such as ether, alcohol, benzene and pyridine. Ruthenium tetraoxide is a strong oxidizing agent that also reacts with many other organic compounds like olefins, sulfides, primary and secondary alcohols, and aldehydes, and will also degrade benzene rings.

The ruthenium tetraoxide, along with unreacted ozone and other gases is then fed from one or more reaction vessels into a heated collection vessel, the conditions in the collection vessel being sufficient to convert a major portion of the gaseous ruthenium tetraoxide into ruthenium dioxide ($RuO_2$) according to the reaction (2) below:

$$RuO_4 \rightarrow O_2 + RuO_2 \qquad (2)$$

The ruthenium dioxide deposits on the walls of the collection vessel and/or collection surfaces or substrates disposed within the collection vessel. The collected ruthenium dioxide is then reduced to produce the purified ruthenium. When using hydrogen gas as the reducing agent, the reduction proceeds according to the reaction (3) below:

$$RuO_2 + 2H_2 \rightarrow Ru + 2H_2O \qquad (3)$$

The morphology of both the ruthenium dioxide and the resulting ruthenium was related to the temperature of the collection vessel. The collection vessel employed by the applicants was surrounded by a single zone furnace that resulted in a non-uniform temperature profile along the length of the collection vessel. The furnace temperature set point was achieved near the midpoint of the collection vessel, with the temperature decreasing towards both ends of the collection vessel. The predominant morphology of the purified ruthenium deposited in the collection vessel was crystalline needles, but a finer grained mirror-like region was also observed toward the inlet side of the collection vessel. If desired, a collection vessel with a more uniform profile could be utilized to produce deposits comprising essentially a single morphology, either crystalline needles or a mirror-like layer. This crystallographic selectivity could also be employed to coat selected substrates, e.g. wafers or metallic substrates, with either the crystalline needles or a mirror-like layer of ruthenium dioxide or, after reduction, ruthenium.

Figure 6:
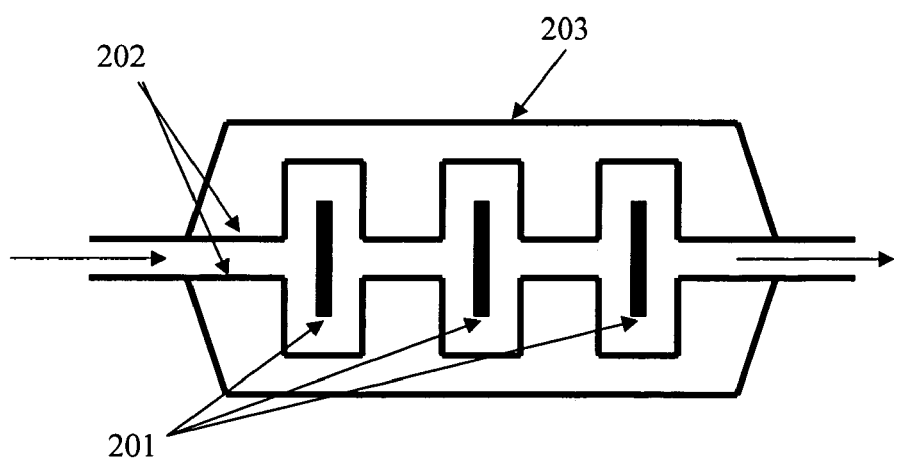
FIG. 6 illustrates a possible configuration for a collection vessel that provides a series of collection surfaces upon which the $RuO_2$ would be deposited and subsequently reduced to form Ru.

Similarly, a collection vessel could be provided with a series of heated collection surfaces (201) that could be more easily removed from the collection vessel for recovery of the ruthenium as depicted in FIG. 6. Depending on the construction, the walls of the collection vessel itself (202) could be kept at or near room temperature to reduce the potential for $RuO_2$ deposition. Alternatively, a cooling fluid could be introduced into optional shell (203) to cool the walls of the collection vessel below room temperature or simply to control the heating resulting from the proximity of the collection surfaces (201). For coating a substrate, a configuration similar to that shown in FIG. 6 could be utilized with the collection surfaces (201) serving as platens or chucks that will both hold and heat the substrates to be coated. For the production of ruthenium, however, the crystalline needle morphology is preferred as the crystals may be gently removed from the walls of the collection vessel to collect the desired ruthenium product.

EXAMPLE 1

Using the apparatus generally depicted in FIG. 1, 487.1 g of ruthenium metal sponge was charged in the first reaction vessel (2) and 499.6 g of ruthenium metal sponge was charged in the second reaction vessel (3). The ozone generator (1) supplied a mixture of ozone (11.5%) and oxygen to the first reaction vessel at a rate of 3 liters/min. The observed reaction efficiency was just under 4%, assuming that reaction (4) is the primary reaction, resulting in the reaction of 2.5 g of $$Ru + 2O_3 \rightarrow RuO_4 + O_2 \qquad (4)$$

ruthenium in the first reaction vessel and 1.0 g of ruthenium in the second reaction vessel. The ozone reacted with the ruthenium metal sponge at room temperature and pressure to form ruthenium tetraoxide which was visible in the reaction vessels (1, 2) as a pale green gas. The ruthenium tetraoxide, together with the unreacted ozone and oxygen, was then fed into the collection vessel (4) which comprised a 32"×2⅜" i.d. (approximately 813 mm×60 mm) glass tube with a wall temperature of approximately 450° C. After a reaction time of 160 minutes, the collection vessel exhibited an accumulation of ruthenium dioxide, the predominant morphology being crystalline needles. The system was then purged with nitrogen gas to remove the residual oxygen and ozone. Hydrogen gas was then fed into the collection vessel, again with a wall temperature of approximately 450° C. at the midpoint, to reduce the deposited ruthenium dioxide to obtain ruthenium metal. Clearly, if there was a need to obtain ruthenium dioxide, the deposits within the collection vessel could simply be removed prior to the reduction treatment. The collection vessel was then disassembled and the ruthenium metal collected. An analysis of the composition of the starting ruthenium metal sponge and the recovered ruthenium metal is shown in Table 1 below.

TABLE 1

| Trace Metal | Starting (ppm) | After Purification (ppm) |
|---|---|---|
| Ni | 2 | 0.3 |
| Cu | 2 | 0.1 |
| Fe | 88 | 2.0 |
| Al | <10 | 0.3 |
| Ca | 15 | 0.2 |
| Si | 76 | 10 |
| Mg | 8 | 0.1 |
| Cr | 4.1 | 0.6 |

Among the advantages provided by the present invention is the high purity achieved by an essentially "dry" process that does not require temperatures above 500° C. and eliminates the need for expensive reagents or resins and does not require highly specialized equipment. Another advantage is that the concentration of ruthenium tetraoxide is relatively low and its residence time in the apparatus is relatively short (as it flows from the reactor into the collection vessel) so the risk of explosion is minimized. The applicants also believe that the relatively limited residence time also reduces the formation of undesirable byproducts within the apparatus and/or on the ruthenium source.

The reaction rates obtained with experimental apparatus utilized by the applicants (FIG. 1) were limited by the physical limitations of the equipment. The applicants fully anticipate that both major and minor changes in the apparatus and process conditions would improve, perhaps substantially, the system performance without compromising the advantages of the present invention. In particular, changes that resulted in an increase the degree of contact between the ozone and the ruthenium source during the residence time would be beneficial. Based on limited experimental observation, the applicants believe that the ruthenium-ozone reaction rate does not exhibit a linear relationship with increasing ozone concentration. Indeed, it appears that the reaction efficiency improves dramatically above a threshold ozone concentration of between 10% and 11% for reactants near room temperature.

Figure 4A:
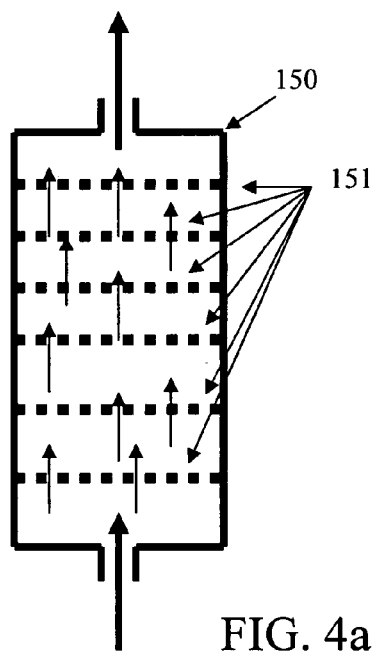
FIG. 4a illustrates a possible configuration for a reaction vessel in which a series of perforated plates are provided for the support of the ruthenium source in the ozone-containing gas stream.
Figure 4B:
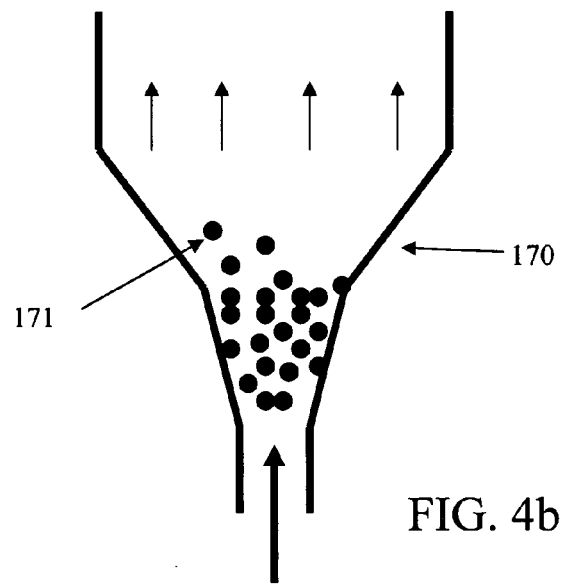
FIG. 4b illustrates a possible configuration for a reaction vessel in which the ruthenium source is supported within a fluidized bed by the flow of the ozone-containing gas stream.

One configuration that would achieve this improvement involves flowing the ozone/oxygen mixture through a large chamber (150) containing a series of trays (151) loaded with a thin layer of the ruthenium source as depicted in FIG. 4a. Another configuration that would achieve this improvement would be a fluidized-bed chamber (170) in which the particles of the ruthenium source (171) are suspended and agitated by the oxygen/ozone flow as depicted in FIG. 4b. Yet another configuration would employ mechanical means to induce turbulent gas flow and/or agitate the ruthenium source to promote more uniform mixing between the gas and solid phases. The applicants also anticipate that adjustments to the oxygen/ozone mixture composition, the gas flow rate, and the reaction temperature may provide further improvements to the efficiency of the basic process for ruthenium purification.

Figure 5:
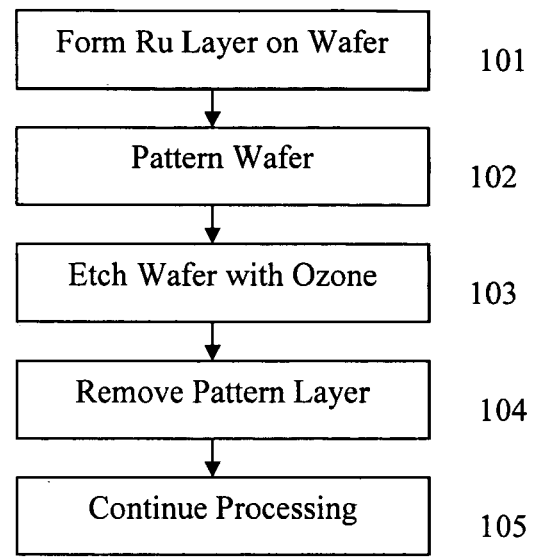
FIG. 5 illustrates a basic series of process steps that could be used to etch a ruthenium layer during semiconductor processing.

In addition to the purification of ruthenium and ruthenium compounds, the basic chemistry embodied in the present invention has practical application as an etch process for semiconductor, circuit board, or other instances in which a thin ruthenium film is to be etched. Compared to other metal etching processes, the low temperature and relatively high pressures (near ambient pressure and temperature) at which ozone could be used to etch ruthenium layers eliminate the need for expensive process gases, vacuum chambers and their associated load locks and vacuum pumps, and reduce the overall power consumption associated with the etch process. Any ozone necessary for the process could be produced on site, thereby, avoiding the risks associated with the transportation, storage, and use of high pressure gas cylinders. Similarly, any unreacted ozone could be removed from the exhaust stream by known catalytic or temperature treatments, thereby reducing any environmental impact of the present process when compared with some of the prior art etch chemistries. The advantages provided by the on-site production of the ozone are, of course, equally applicable to the disclosed process for the purification of ruthenium. As envisioned by the applicants, a typical etch process would start with a semiconductor wafer having as its surface layer ruthenium metal. The wafer would be patterned with some barrier material, such as photoresist, and then contacted with an ozone-containing gas stream to oxidize the exposed ruthenium metal to produce the volatile ruthenium tetraoxide $RuO_4$ that is then removed from the etch chamber. The basic process flow for such a process is provided in FIG. 5.

What we claim is:

1. A method for forming a high purity ruthenium pattern on a semiconductor substrate comprising the steps of:
   placing a ruthenium source in a first container;
   feeding an ozone-containing gas stream into the first container;
   forming a reaction gas stream comprising ozone, oxygen, and ruthenium tetraoxide;
   feeding the reaction gas into a collection vessel containing the semiconductor substrate;
   reducing ruthenium tetraoxide from the reaction gas on a major surface of the semiconductor substrate to form a ruthenium dioxide layer on the major surface;
   purging the collection vessel to remove essentially all remaining reaction gas; and
   reducing the ruthenium dioxide layer to obtain a high purity ruthenium layer on the semiconductor substrate.

2. The method for forming a high purity ruthenium pattern on a semiconductor substrate according to claim 1, wherein hydrogen gas is used in the step of reducing the ruthenium dioxide.

3. The method for forming a high purity ruthenium pattern on a semiconductor substrate according to claim 2, wherein the major surface of the semiconductor wafer is maintained at a temperature of at least about 110° C.

4. The method for forming a high purity ruthenium pattern on a semiconductor substrate according to claim 2, wherein the major surface of the semiconductor substrate is maintained at a temperature sufficient to both reduce the ruthenium tetraoxide and decompose any residual ozone in the reaction gas.

5. The method for forming a high purity ruthenium pattern on a semiconductor substrate according to claim 4, wherein the major surface of the semiconductor substrate is maintained at a temperature of at least about 450° C.

6. The method for forming a high purity ruthenium pattern on a semiconductor substrate according to claim 2, wherein the high purity ruthenium layer is characterized by a predominate ruthenium crystalline morphology.

7. The method for forming a high purity ruthenium pattern on a semiconductor substrate according to claim 1, wherein the high purity ruthenium pattern contains ruthenium having a purity of at least 99.99%.

8. The method for forming a high purity ruthenium pattern on a semiconductor substrate according to claim 1, further comprising:
   removing the semiconductor substrate from the collection vessel;
   forming an etching pattern on the high purity ruthenium layer that exposes regions of the high purity ruthenium layer;
   etching the ruthenium layer to remove the exposed portions of the high purity ruthenium layer and thereby form a high purity ruthenium pattern.

9. The method for forming a high purity ruthenium pattern on a semiconductor substrate according to claim 8, wherein:
   etching the ruthenium layer includes contacting the exposed portions of the ruthenium layer with ozone.

10. The method for forming a high purity ruthenium pattern on a semiconductor substrate according to claim 9, wherein:
    the ozone is present in a fluid selected from a group consisting of liquid, gas and plasma.

11. The method for forming a high purity ruthenium pattern on a semiconductor substrate according to claim 10, wherein:
    the ozone is the primary etchant present in the fluid.

12. The method for forming a high purity ruthenium pattern on a semiconductor substrate according to claim 8, further comprising:
    removing the etching pattern from a remaining portion of the ruthenium layer after removing the exposed portions of the ruthenium layer to ozone.

* * * * *